(12) United States Patent
Chen et al.

(10) Patent No.: US 8,580,401 B2
(45) Date of Patent: Nov. 12, 2013

(54) CURABLE MATERIAL AND ITS APPLICATION

(75) Inventors: Shinn-Horng Chen, Kaohsiung (TW); Ruei-Tang Chen, Kaohsiung (TW); Che-Wei Su, Kaohsiung (TW)

(73) Assignee: Eternal Chemical Co., Ltd., Kaohsiung (TW)

( * ) Notice: Subject to any disclaimer, the term of this patent is extended or adjusted under 35 U.S.C. 154(b) by 0 days.

(21) Appl. No.: 13/170,383

(22) Filed: Jun. 28, 2011

(65) Prior Publication Data
US 2012/0193611 A1 Aug. 2, 2012

(30) Foreign Application Priority Data

Feb. 1, 2011 (TW) .............................. 100103891 A

(51) Int. Cl.
*H01L 51/54* (2006.01)
(52) U.S. Cl.
USPC ........... 428/690; 428/917; 313/504; 313/505; 313/506; 257/400; 257/E51.05; 257/E51.026; 257/E51.032; 564/26; 564/426; 564/434
(58) Field of Classification Search
USPC .................. 428/690, 917; 313/504, 505, 506; 564/26, 426, 434; 257/40, E51.05, 257/E51.026, E51.032
See application file for complete search history.

(56) References Cited

U.S. PATENT DOCUMENTS

| 3,172,862 A | 3/1965 | Gurnee et al. |
| 3,986,873 A * | 10/1976 | Sirotkina et al. ................ 430/77 |
| 4,356,429 A | 10/1982 | Tang |

FOREIGN PATENT DOCUMENTS

JP 2008-234857 * 10/2008

* cited by examiner

*Primary Examiner* — Gregory Clark
(74) *Attorney, Agent, or Firm* — Greer, Burns & Crain, Ltd.

(57) ABSTRACT

A curable material is provided. The curable material has the structure of formula I or formula II:

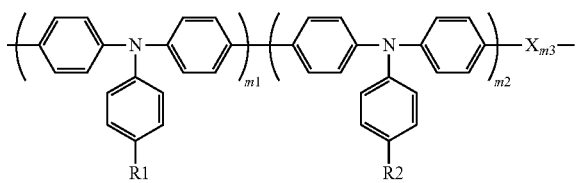

[formula I]

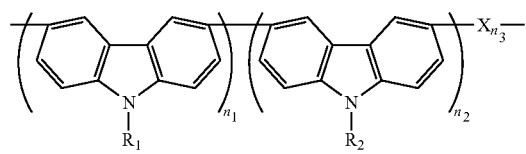

[formula II]

wherein, X, R1, R2, m1 to m3, and n1 to n3 are defined as cited in the description.

13 Claims, 1 Drawing Sheet

CURABLE MATERIAL AND ITS APPLICATION

CROSS REFERENCE

This application claims the benefit of Taiwan Patent Application No. 100103891, filed on Feb. 1, 2011 in the Taiwan Intellectual Property Office, the disclosure of which is incorporated herein in its entirety by reference.

BACKGROUND

1. Field of the Invention

The present invention relates to a curable material. In particular, the present invention relates to a curable material that can be used in an organic electroluminescent device as a hole transporting layer material.

2. Descriptions of the Related Art

The organic electroluminescent phenomenon was firstly observed and studied in the 1960s (E. Gurnee et al., U.S. Pat. No. 3,172,862 (1965)). Kodark Company (US) invented an organic light emitting diode (OLED) in the 1980s and used the vapor deposition method to prepare a double layer structure of organic films (C. W. Tang, U.S. Pat. No. 4,356,429 (1987), and C. W. Tang et al., *Appl. Phys. Lett.* 51, 12:913 (1987)). Since then, studies of organic light emitting diode (OLED) have become popular and progressed quickly and the organic light emitting diode is applied in the technology of panel display.

Organic light emitting diodes, comprising such as polymer light emitting diode (PLED) has been wildly used in information, communication and consumer electronic products due to advantages, such as low power consumption, long service life of elements, fast reaction response, and gradually replaces the incandescent lamp and becomes a better choice for the light source of the new century.

The organic electroluminescent device 1, for example, shown in FIG. 1 comprises a substrate 11, an anode 13, a hole transporting layer (HTL) 15, an emitting layer 17, an electron transporting layer (ETL) 18 and a cathode 19. When a forward bias is applied to the organic electroluminescent device 1, the electrons and holes are injected to the device from the cathode 19 and the anode 13 respectively and is driven by external voltage energy. The electrons and holes migrate in the layer structure due to the potential difference caused by the external electrical field and recombine in the emitting layer 17 to form excitons. Then, the energy is released and the ground state is attained so that the luminescent material of the emitting layer 17 can generate a light emitting effect.

The hole transporting layer of the organic light emitting diode is responsible for transporting the holes to the emitting layer and at the same time, blocks the electrons (from the cathode) that are migrating to the anode. The hole transporting layer has advantages of reducing the driving voltage and increasing the luminous efficiency. Commonly used hole transporting layer materials have some obvious disadvantages, such as poor hole transporting ability for most of the blue or green luminescent materials due to mismatched energy levels; i.e., the difference in energy level between the hole transporting layer material and emitting material is too great. In addition, exciton quenching easily occurs at the interface between the luminescent material and hole transporting layer material, thus, reducing the luminous efficiency of the organic light emitting diode. In addition, in the process for fabricating an organic light emitting diode, particularly a polymer light emitting diode, the emitting layer is usually prepared by a spin coating method, and thus, it is necessary to use organic solvents. The structure of the underlying hole transporting layer can be easily damaged (for example, generating an uneven surface, increasing roughness or producing pores) while spin coating the emitting layer because the hole transporting layer material has insufficient organic solvent resistance. This would impede the combination between electrons and holes, then, further affecting the luminous efficiency of the organic light emitting diodes.

Based on the above, the present invention provides a curable material. When the curable material is used as a hole transporting layer material, it does not have the disadvantage of known hole transporting layer materials, and further improves the luminous efficiency of the organic electroluminescent device.

SUMMARY

One objective of the present invention is to provide a curable material which has a structure of formula I or formula II:

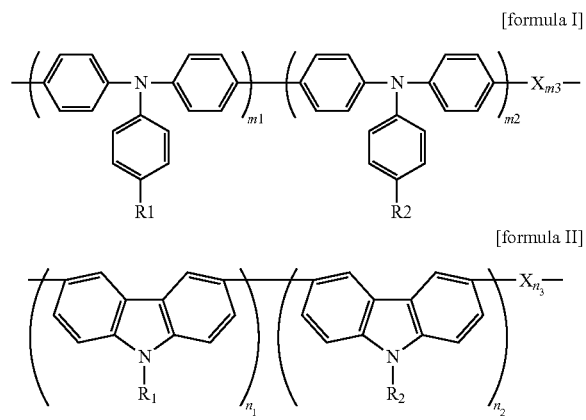

wherein,

X is a divalent organic group;

R1 is selected from the group consisting of

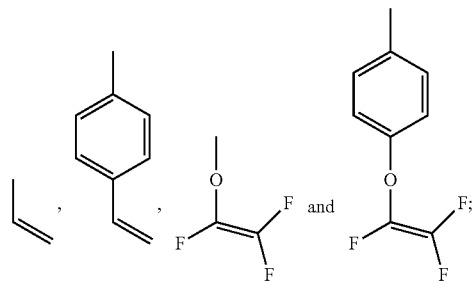

R2 is a mono-valent organic group without a curable group;

m1, m3, n1 and n3 are independently an integer greater than 1; and m2 and n2 are independently 0 or an integer greater than 1.

Another objective of the present invention is to provide an organic electroluminescent device, comprising a first conductive layer, a hole transporting layer, an emitting layer, an electron transporting layer, and a second conductive layer, wherein the hole transporting layer comprises the aforesaid curable material.

The detailed technology and preferred embodiments implemented for the subject invention are described in the following paragraphs for people skilled in this field to well appreciate the above objectives, technical features and advantages of the claimed invention.

DETAILED DESCRIPTION

Figure 1:
FIG. 1 is a schematic diagram of a known organic light emitting device.

Hereinafter, some embodiments of the present invention will be described in detail. However, the present invention may also be practiced in various different forms without departing from the spirits of the present invention. The scope of the present invention shall not be limited to what is described herein. In addition, to make the drawings clearer, the size of each element and area in the drawings may be exaggerated without drawing the element to actual scale. Unless it is additionally explained, the expressions "a," "the," or the like recited in the specification (especially in the claims) should include the singular and the plural forms and the number of carbon atoms in a group recited herein does not include the number of carbon atoms in the substituent of the group.

The curable material of the present invention can generate crosslinking structure by heating and then be cured. The solubility of the cured product in common organic solvents is greatly reduced, and therefore, the problem of poor luminous efficiency due to the dissolution of the hole transporting layer material in a solvent occurred in the prior art can be solved. Furthermore, the present invention allows the energy level of the curable material of the present invention to be closer to the species of the luminescent material by combining the corresponding luminescent material and adjusting the component ratio. The problem of mismatching the energy level between the hole transporting layer material and the luminescent material (such as blue or green light) in the known organic electroluminescent device then can be solved and the luminous efficiency of the organic electroluminescent device is improved.

The curable material of the present invention has a structure of formula I or formula II:

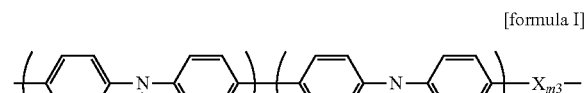

[formula I]

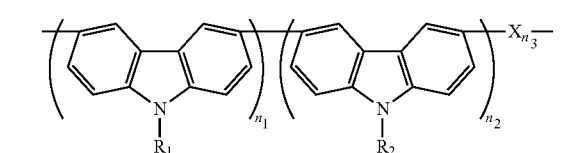

[formula II]

wherein,
X is a divalent organic group;
R1 is selected from the group consisting of

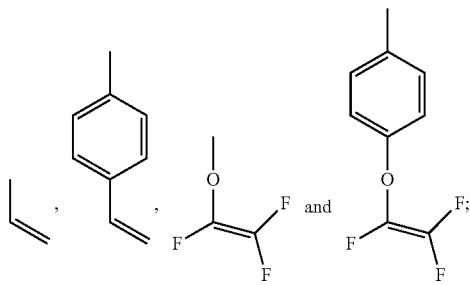

R2 is a mono-valent organic group without a curable group;
m1, m3, n1 and n3 are independently an integer greater than 1; and
m2 and n2 are independently 0 or an integer greater than 1.
R1 and R2 are different, and preferably m1 is an integer of 1 to 180; m2 is an integer of 2 to 180; m3 is an integer of 5 to 360; n1 is an integer of 1 to 200; n2 is an integer of 2 to 200; and n3 is an integer of 5 to 400.

In the curable material of the present invention with a structure of formula I or formula II, unit X can be any suitable divalent luminescent group, and is usually selected based on the material of the emitting layer of the applied organic electroluminescent device. When the curable material of the present invention is applied in the hole transporting layer of the organic electroluminescent device, the polymerization unit (i.e., unit X) has an incorporated organic luminescent group. The energy level between the hole transporting layer and emitting layer is more closely matched. The difficulty in the hole electron transition recombination is reduced. The luminous efficiency of the organic electroluminescent device is increased. Also, the solvent resistance of the hole transporting layer is also increased by a curing procedure to enhance the structural stability during spin coating process, and thus, the luminous efficiency of the organic electroluminescent device is further improved. In some embodiments of the present invention, X is an organic luminescent group with the following structure:

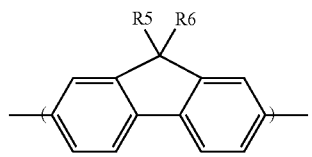

wherein, R5 and R6 can be the same or different, and are independently a substituted or unsubstituted C2 to C40 aliphatic group or a substituted or unsubstituted C6 to C40 aromatic group, and preferably, a substituted or unsubstituted C4 to C16 aliphatic group or substituted or unsubstituted C6 to C20 aromatic group, comprising, for example, a butyl group, pentyl group, hexyl group, octyl group, or phenyl group substituted by an alkyl group or alkoxy group. It should be noted that the term "substituted" represents any groups or atoms except for the hydrogen atom. That is, the hydrogen atom of the group is substituted by a substituent. The substituent can be, for example, a halogen atom, hydroxyl group, cyano group, carboxyl group, alkyl group, epoxy group, or alkoxy group, and preferably, an alkyl group or alkoxy group. The alkyl group represents —$C_mH_{2m+1}$ where m is an integer of 1 to 4, and the alkoxy group represents —$OC_nH_{2n+1}$ where n is an integer of 1 to 20. In some embodiments of the present invention, R5 and R6 independently represent:

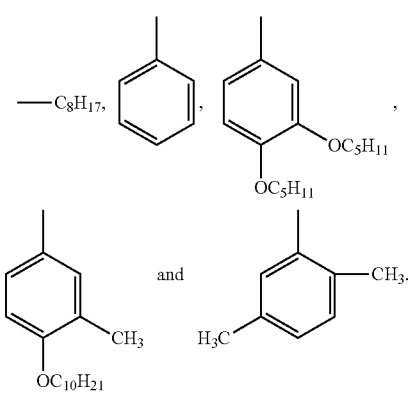

In the following examples, X is

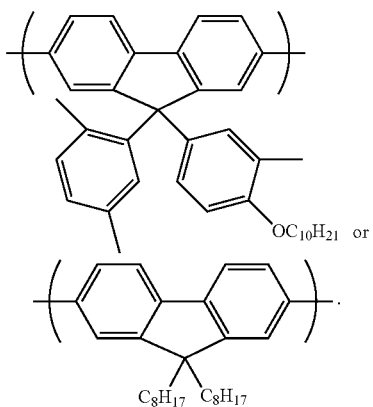

In the present invention, the content of unit X is not particularly limited and is selected based on the user's needs in application. In general, the ratio of (m1+m2) and m3 and the ratio of (n1+n2) and n3 are independently about 0.6 to about 1.8, preferably about 0.8 to about 1.2. More preferably, the ratio of (m1+m2) and m3 and the ratio of (n1+n2) and n3 are independently about 1.

R1 used in the present invention must have a curable group, for example a group with a double bond, to conduct a crosslinking reaction upon heating and exhibit the curing effect. After curing, the curable material of the present invention shows increased solvent resistance, and therefore, the luminous effect of the applied organic electroluminescent device is improved. R1 is preferably selected from the group consisting of the following:

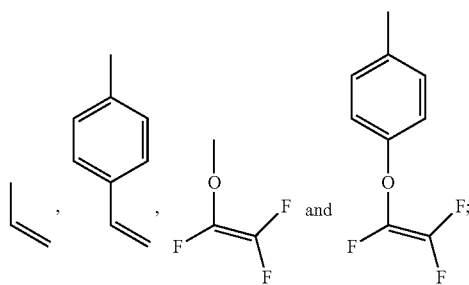

in some embodiments of the present invention, R1 is

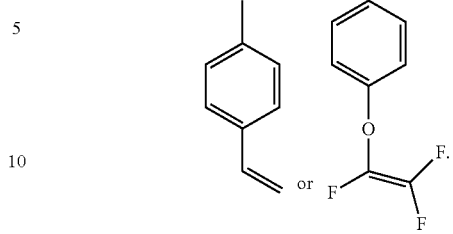

R2 used in the present invention does not have a curable group, and therefore, cannot conduct crosslinking reaction upon heating. It is preferred that R2 is a substituted or unsubstituted C2 to C8 aliphatic group or substituted or unsubstituted C6 to C20 aromatic group, for example but not limited to an ethyl group, propyl group, butyl group, pentyl group, or phenyl group substituted or unsubstituted by an alkyl group or alkoxy group. The term "substituted" is the same as previously described. In some embodiments of the present invention, R2 is a butyl group or

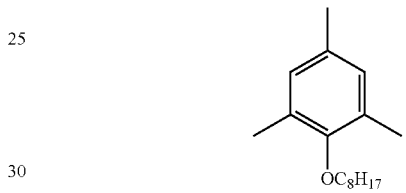

In the curable material of the present invention, the polymerization unit represented by m2 and n2 and the polymerization unit represented by m1 and n1 have similar structure with each other. Their main difference is that the former does not have a curable group (i.e., R2 group) but the later has a curable group (i.e., R1 group). Because the polymerization unit with a curable group (i.e., the unit represented by m1 and n1) is more expensive and the desirable curing effect can be achieved by using a certain percentage of the polymerization unit with a curable group, the polymerization unit without a curable group (i.e., the unit represented by m2 and n2) can be optionally added to reduce the cost. In other words, the curable material of the present invention can comprise or not comprise the polymerization unit represented by m2 and n2 based on the user's desired curing effect and use. In practical application, the ratio of m2 and m1 and the ratio of n2 and n1 usually are independently from 0 to about 20, preferably, from about 2 to about 10. According to the followings examples, the ratio of m2 and m1 is about 1:0.136 and the ratio of n2 and n1 is about 1:0.25.

It is worthwhile to note that the polymerization units in formula I or formula II can be arranged in any order and not limited to the embodiments illustrated in the specification. In other words, the polymers of formula I or formula II can be random polymers; i.e., each polymerization unit can be arranged in random order (such as abc, bac, cba, etc.) to form the polymer backbone.

In addition, other known crosslinkers can be added to the curable material of the present invention, for example but not limited to dicumyl peroxide (DCP), to enhance the curing effect.

As shown in the following examples, the curable material with the structure of formula I or formula II of the present invention can be prepared by Suzuki coupling reaction. Taking formula I as an example (but not limited by it), the polymerization method of Suzuki coupling reaction can be carried out by the following steps:

(1) The embodiment that does not comprise the m2 unit

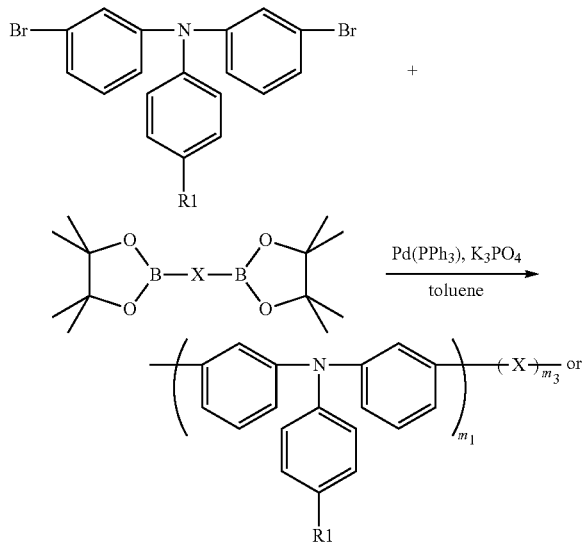

(2) The embodiment that comprises the m2 unit

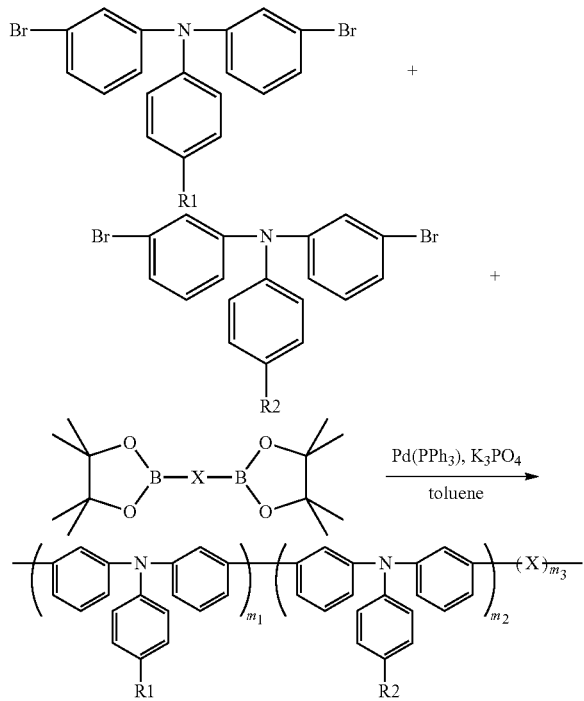

Furthermore, without being bound by theory, after reviewing the disclosure of the specification, people with ordinary skills in the art can prepare the curable material with the structure of formula I or formula II of the present invention with other manners based on their knowledge or by limited experiments.

Although the molecular weight of the curable material of the present invention is not particularly limited, its weight average molecular weight is usually about 3,000 to about 300,000, preferably about 5,000 to about 100,000 based on the consideration that the material may have a very high viscosity as its molecular weight is overly high, thus increasing the difficulty for use.

The curable material of the present invention can be applied in the organic electroluminescent device as a hole transporting layer material. The aforesaid organic electroluminescent device can comprise an anode for hole injection, a cathode for electron injection and an organic medium placed between the electrodes to support charge recombination (generating light emission). These devices are often named as organic light emitting diodes (OLED).

The present invention also provides an organic electroluminescent device which comprises a first conductive layer, a hole transporting layer, an emitting layer and a second conductive layer wherein the hole transporting layer comprises the aforesaid curable material and the organic electroluminescent device can further comprise an electron transporting layer optionally. More specifically, the first conductive layer is used as an anode and in general is a transparent conducting oxide (TCO), for example but not limited to fluorine-doped tin oxide (FTO), antimony-doped tin oxide (ATO), zinc oxide (ZnO), aluminum-doped zinc oxide (AZO), or indium tin oxide (ITO), metal nitride (such as gallium nitride), metal selenide (such as zinc selenide) and metal sulfide (such as zinc sulfide). The second conductive layer is a cathode and can comprise any conductive material. It is preferred that the material has a good thin film-forming property to ensure sufficient contact between the second conductive layer and emitting layer to promote the electron injection under low voltage and provide better stability. For example, the material of the cathode can be a metal (such as aluminum, calcium), metal alloy (such as magnesium/silver, aluminum/lithium) or mixtures thereof. Moreover, an extremely thin film of lithium fluoride (LiF) may be optionally placed between the cathode and the emitting layer. Lithium fluoride can effectively reduce the energy barrier of injecting electrons to the emitting layer from the cathode. In addition, the emitting layer plays a very important role in the whole structure of the organic electroluminescent device. In addition to determining the color of the device, the emitting layer also has an important impact on the luminance efficiency in a whole. Common luminescent materials can be classified as fluorescence and phosphorescence depending on the light emitting mechanism. The fluorescent materials are generally organic molecules while the phosphorescent materials are generally transition metal compounds. Whether it is a fluorescent material or phosphorescent material, the energy level difference of the compound per se can be adjusted by modifying the molecular structure or functional group to achieve the objective of changing the light emitting color.

Figure 2:
FIG. 2 is an embodiment of the organic light emitting device using the curable material of the present invention.

Furthermore, a PEDOT:PSS layer can be coated between the first conductive layer and the hole transporting layer to increase the adhesion between the first conductive layer and the hole transporting layer as shown in FIG. 2. FIG. 2 is an embodiment using the organic electroluminescent device using the curable material of the present invention. The organic electroluminescent device 2 comprises a glass substrate 21, an anode made of ITO 23, a PEDOT:PSS layer 251, a hole transporting layer made of the curable material of the present invention 253, an emitting layer made of 9,9-dioctylfluorene polymer 27 and a cathode made of aluminum and calcium 29. The detailed fabrication method is described in the following examples and is not additionally mentioned herein. It should be noted that in addition to the above glass substrate, the substrate of the organic electroluminescent device of the present invention can be made of any suitable flexible or non-flexible material, such as plastic. For example, the substrate of the organic electroluminescent device can be made of a resin selected from the group consisting of polyester resin such as polyethylene terephthalate (PET) or polyethylene naphthalate (PEN); polyacrylate resin such as polymethyl methacrylate (PMMA); polyolefin resin such as polyethylene (PE) or polypropylene (PP); polycycloolefin resin; polyimide resin; polycarbonate resin; polyurethane resin; polyvinyl chloride (PVC); triacetyl cellulose (TAC); polyacetic acid or combinations thereof.

In addition to the above use, the curable material of the present invention can also be applied into other fields that are similar or identical to the organic electroluminescent devices in principle, such as organic photovoltaics (OPVs) or dye-sensitized solar cells.

The present invention will be further illustrated by the following embodiments.

Example 1

The Preparation of Curable Material

[The Preparation of Curable Material 1]

First, N,N-bis(4-bromophenyl)-p-(4-vinylphenyl)aniline (3) was synthesized. Tri(4-bromophenyl)amine (1) and p-vinylphenyl boric acid (2) with a molar ratio of about 2:1 and zero valence palladium compound $(PPh_3)_4Pd(0)$ as a catalyst in a suitable amount were dissolved in a mixture solution consisting of tetrahydrofuran (about 20 mL) and 2M potassium phosphate aqueous solution (about 11 mL). The resulting mixture was first purged with argon and vigorously stirred at about 100° C. and reacted for about 48 hours. The reaction scheme is as follows:

The obtained mixture after reaction was poured into 50 mL water and extracted with dichloromethane (about 250 mL) twice. The combined organic extracts were dried by anhydrous magnesium sulfate and further concentrated by rotary evaporation. Further purification by silica gel column chromatography (ethyl acetate/n-hexane) afforded N,N-bis(4-bromophenyl)-p-(4-vinylphenyl)aniline) (3) as white solids (yield: about 65%; melting point: about 160° C. to about 161° C.). Monomer (3) was analysed by FT-IR, $^1$H NMR and $^{13}$C NMR spectroscopy, elemental analysis and electron impact-mass spectrophotometer (EI-MS). The result is as follows:

FT-IR (KBr pellet, cm$^{-1}$): ν 719, 815, 898, 1068, 1286, 1317, 1484, 1521, 1579, 1602, 1621, 3033, 3054, 3081

$^1$H NMR (400 MHz, CDCl$_3$, ppm): δ 7.54-7.45 (m, 6H, Ar—H), 7.37-7.35 (d, 4H, Ar—H, J=8 Hz), 7.11-7.09 (d, 2H, Ar—H, J=8 Hz), 6.99-6.97 (d, 4H, Ar—H, J=8 Hz), 6.78-6.71 (dd, 2H, =CH—, J$_1$=16 Hz, J$_2$=16 Hz), 5.80-5.76 (d, 1H, =CH$_2$, J=16 Hz), 5.30-5.26 (d, 1H, =CH$_2$, J=16 Hz)

$^{13}$C NMR (500 MHz, CDCl$_3$, ppm): δ 146.38, 146.24, 139.68, 136.45, 136.39, 135.82, 132.43, 127.88, 126.74, 126.69, 126.02, 125.63, 124.45, 115.74, 113.8

Elemental analysis (%): calculated values: C, 61.81; H, 3.79; N, 2.77; measured values: C, 61.70; H, 3.85; N, 2.71.

EI-MS (m/z): calculated value 504.99. found value 505.00.

Then, the curable material 1 was prepared by palladium-catalyzed Suzuki coupling reaction. In particular, the purified N,N-bis(4-bromophenyl)-p-(4-vinylphenyl)aniline) (3), 9,9-di-arylfluorene-2,7-di-boronic acid bis-pinacol ester (4) and 4-(3-methylpropyl)-N,N-bis(4-bromophenyl)aniline) (5) in a molar ratio about 0.12:1:0.88 with zero valence palladium compound $(PPh_3)_4Pd(0)$ as a catalyst in a suitable amount were dissolved in a mixture solution of tetrahydrofuran (THF; about 30 mL) and 2M potassium phosphate aqueous solution (K$_3$PO$_4$, about 16 mL). The resulting mixture was first purged with argon and vigorously stirred at about 100° C. and reacted for about 72 hours for conducting the polymerization reaction. Finally, 0.48 mole of monomer (4) and about 0.48 mole of 1-bromo-4-tert-butylbenzene were added to end-cap the polymer chain. The polymerization scheme is as follows, wherein A1:A2:A3 were about 0.12:1:0.88:

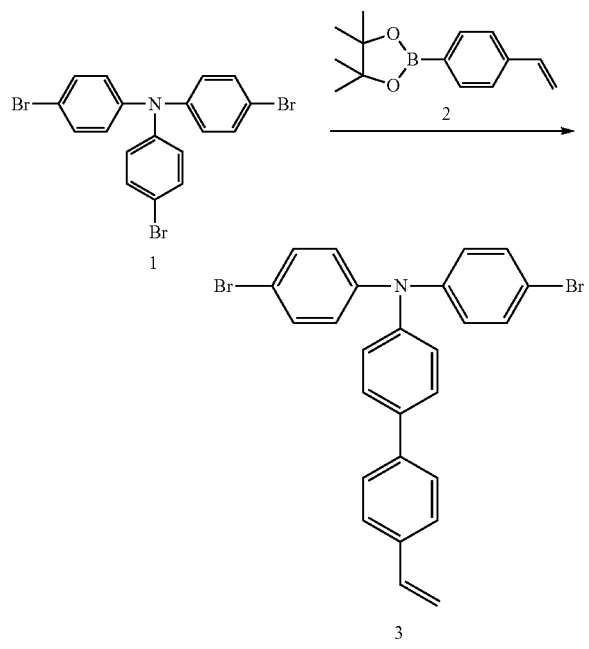

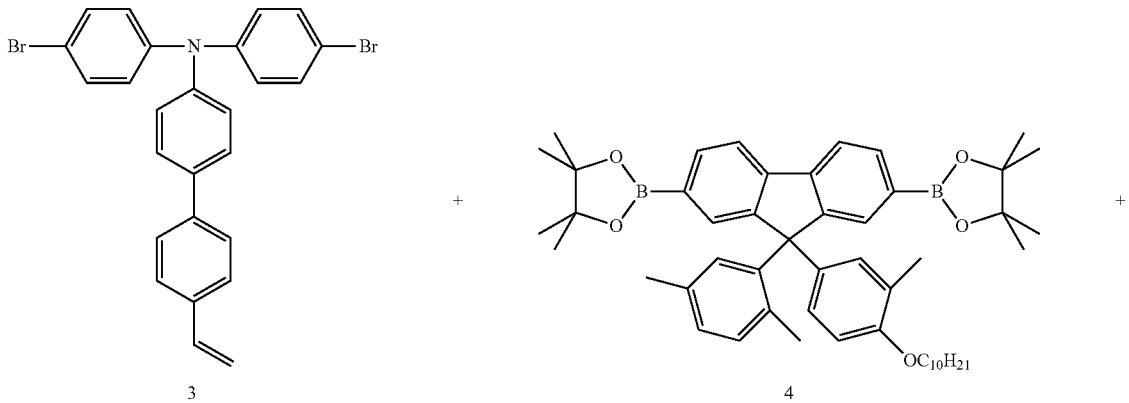

-continued

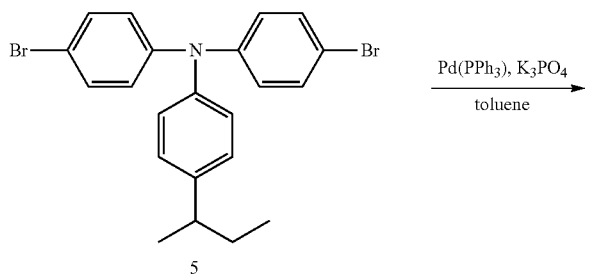

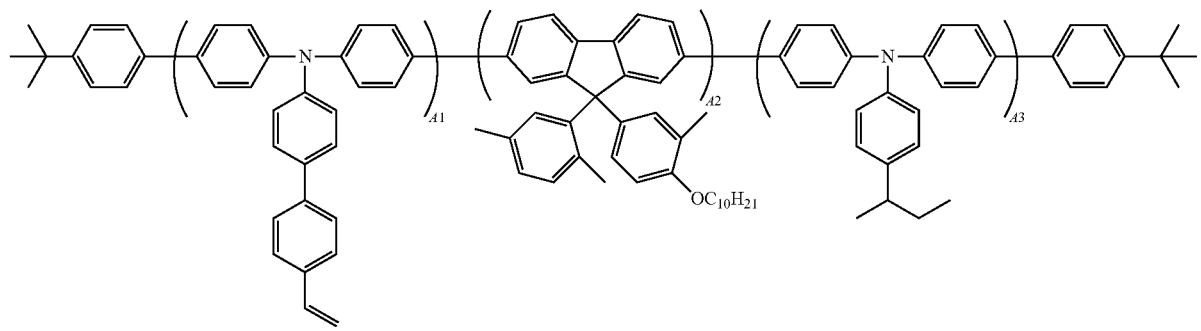

Curable material 1

The obtained mixture after the reaction was poured into a large amount of methanol. The appeared solid was collected, filtered and then washed successively with methanol, isopropanol and hexane, followed by Soxhlet extraction with acetone to remove trace oligomers. The residual palladium catalyst was removed by stirring together with a silica gel (Si-Thiol of Silicycle Company) in toluene. Then, the solution obtained was extracted with deionized water three times to reduce the concentration of metal ions. The solution was then poured into a large amount of methanol to obtain a yellow fiber of the curable material 1 (poly(fluorine-co-triphenylamine)) (yield: about 75%). Poly(fluorine-co-triphenylamine) was soluble in conventional organic solvents (such as toluene, xylene, THF, chloroform). The curable material 1 was analysed by $^1$H NMR, $^{13}$C NMR spectroscopy and elemental analysis. The result is as follows:

$^1$H NMR (400 MHz, CDCl$_3$, ppm): δ 7.78-7.76 (d, Ar—H, J=8 Hz), 7.58-7.56 (d, Ar—H, J=8 Hz), 7.49-7.44 (m, Ar—H), 7.26-7.04 (m, Ar—H), 6.94-6.87 (m, Ar—H), 6.64-6.62 (m, =CH—), 5.80-5.76 (d, =CH$_2$, J=16 Hz), 5.27-5.24 (m, =CH$_2$, J=12 Hz), 3.91 (s, —OCH$_2$—), 2.58-2.56 (m, 1H, —CH—), 2.20 (s, 3H, —CH$_3$), 2.10 (s, 3H, —CH$_3$), 1.80-0.83 (m, —CH$_2$— and —CH$_3$)

$^{13}$C NMR (500 MHz, CDCl$_3$, TMS, 25"C): δ 155.86, 152.83, 147.04, 142.79, 139.60, 138.83, 136.63, 134.63, 134.42, 132.36, 131.31, 130.58, 127.47, 126.62, 126.25, 125.93, 125.08, 124.20, 120.34, 110.32, 66.17, 65.28, 40.98, 39.19, 37.26, 36.32, 31.34, 29.91, 27.93, 24.65, 22.67, 22.58, 21.81, 21.24, 19.73, 16.58, 12.27

Elemental analysis (%): measured values C, 87.64; H, 7.71; N, 1.28.

[The Preparation of Curable Material 2]

The curable material 2 was prepared with the same method as the one for preparing the curable material 1, except that monomers (3), (4), and (5) were replaced by monomers (6), (7), and (8) in the following reaction, and the ratio of B1:B2:B3 was about 0.1:0.5:0.4. The yield was about 75%.

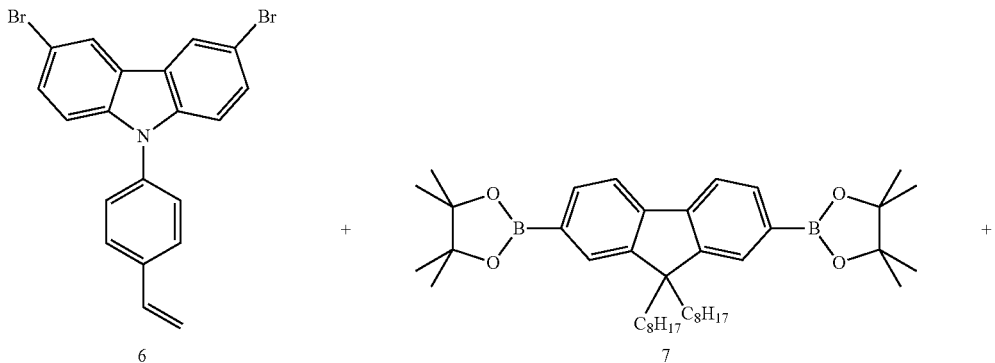

-continued
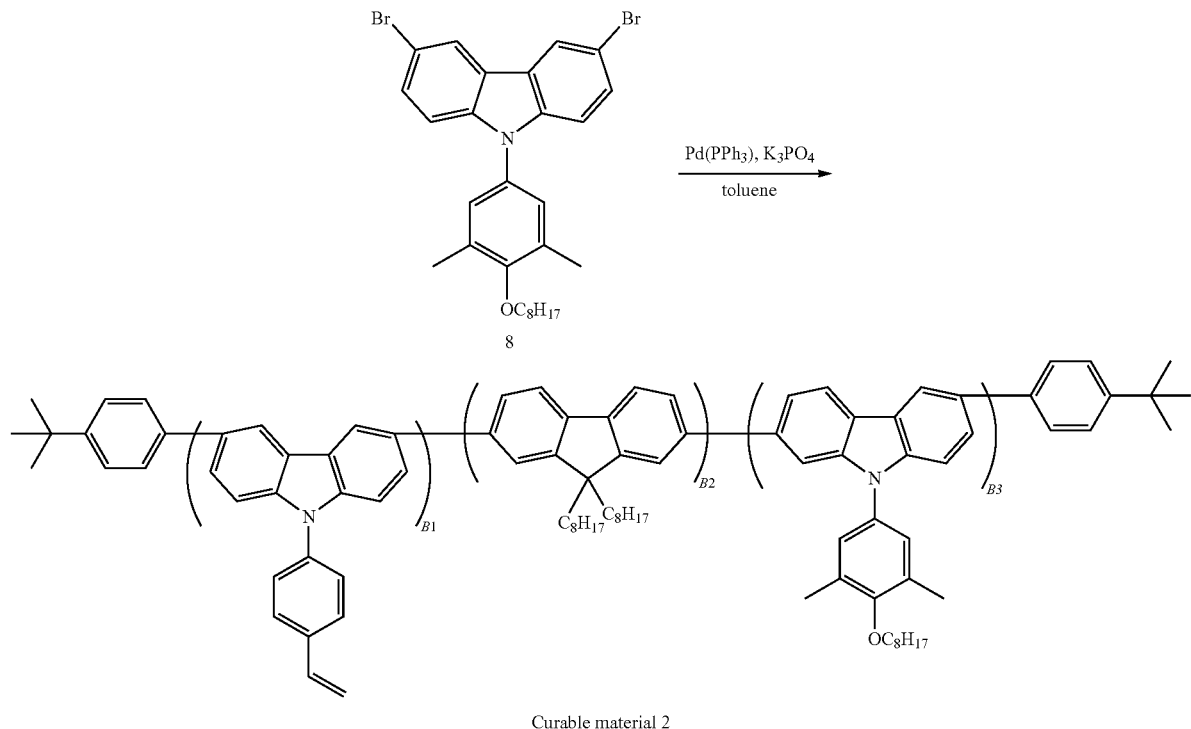
Curable material 2
[The Preparation of Curable Material 3]
The curable material 3 was prepared with the same method as the one for preparing the curable material 1, except that monomers (3), (4), and (5) were replaced by monomers (9), (10), and (11) in the following reaction, and the ratio of C1:C2:C3 was about 0.06:0.5:0.44. The yield was about 75%.
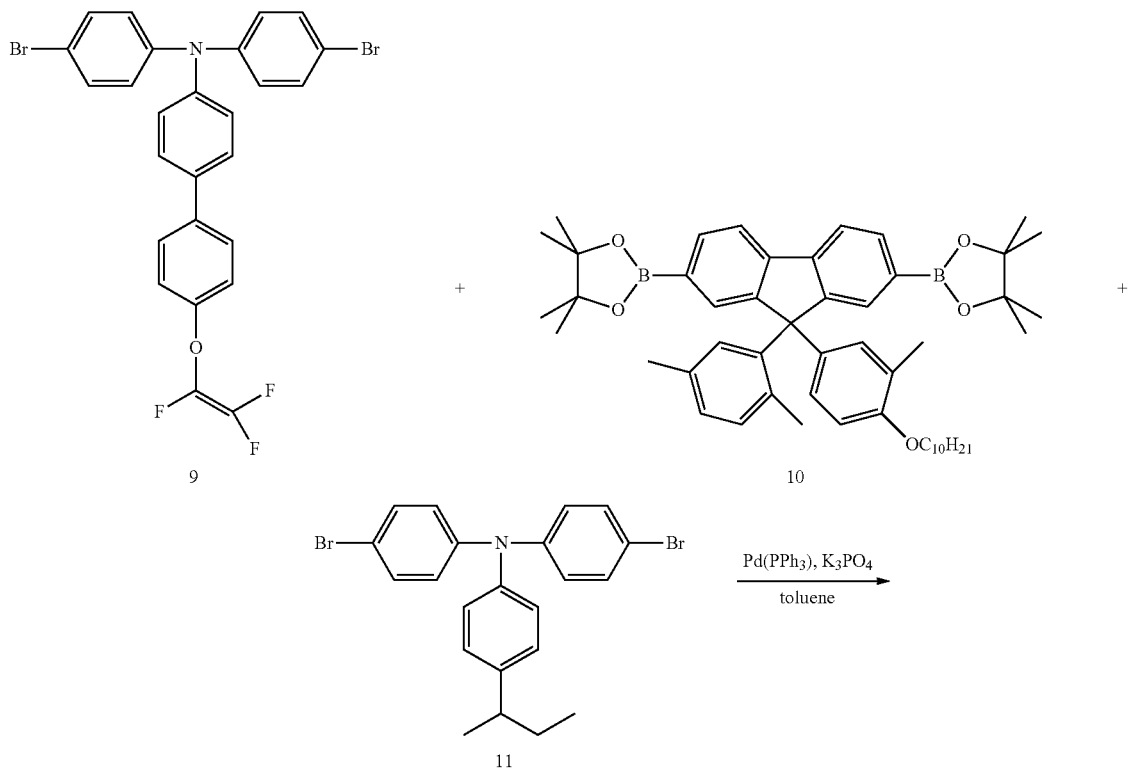

-continued

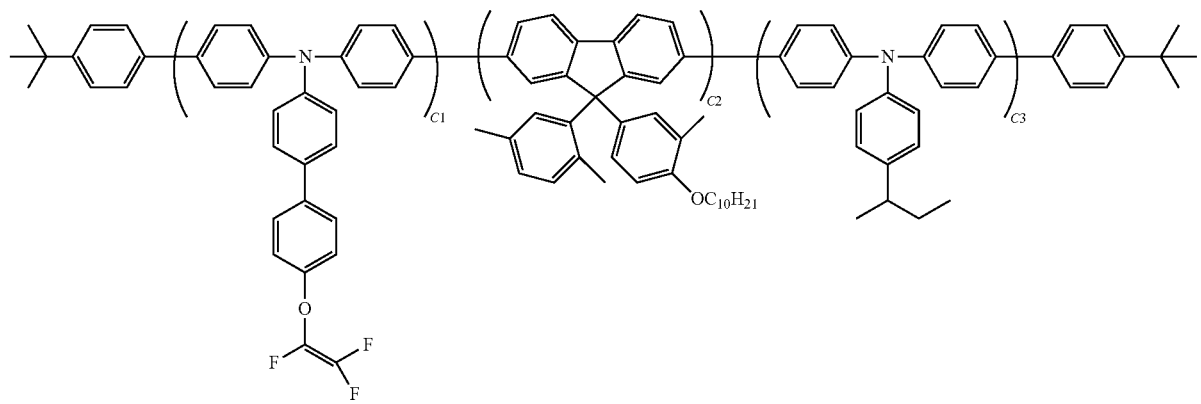

Curable material 3

Example 2

Luminous Efficiency Test

[OLED 1]

The curable material 1 of the present invention was used as a hole transporting layer material to fabricate OLED 1 with a structure as shown in FIG. 2. In particular, an ITO layer was deposited on a glass substrate as an anode. The ITO-coated glass substrate was washed via ultrasonic bath and further treated in a UV-ozone chamber. A PEDOT: PSS layer was spin-coated on the top of the anode and annealed at about 150° C. for about 15 minutes. Then, a toluene solution of the curable material 1 of the present invention was spin-coated on the top of the PEDOT: PSS layer (about 10 mg/mL; about 2000 rpm) and thermally treated at about 230° C. for about 30 minutes under nitrogen atmosphere to cure the curable material 1 to form a hole transporting layer (about 40 nm). Poly (9,9-dioctylfluorene) was then spin-coated on the top of the hole transporting layer as an emitting layer (about 70 nm). Finally, a thin cathode layer was deposited by successive thermal evaporation of a LiF layer (about 1 nm), a Ca layer (about 50 nm) and an Al layer (about 100 nm) under $1 \times 10^{-6}$ torr to accomplish the fabrication of OLED 1. The power supply (Keithley Company (US), Model: 2400) and the fluorescence spectrometer (A Class Technology Associates Inc., Model: usb2000) were used to measure the properties of OLED 1. The result is shown in table 1.

[OLED 2]

OLED 2 was fabricated with the same method as the one for fabricating OLED 1, except that during the coating of the curable material 1 of the present invention to form the hole transporting layer, a heat treatment step for curing the curable material 1 was not conducted. Instead, the emitting layer was coated directly after the solvents were evaporated and the curable material 1 was dried. The power supply (Keithley Company (US), Model: 2400) and the fluorescence spectrometer (A Class Technology Associates Inc., Model: usb2000) were used to measure the properties of OLED 2. The result is shown in table 1.

[OLED 3]

OLED 3 was fabricated with the same method as the one for fabricating OLED 1, except that the toluene solution of the curable material 1 was pre-mixed with DCP (about 1 wt. %) as a crosslinker to enhance the curing effect of the curable material 1. The power supply (Keithley Company (US), Model: 2400) and the fluorescence spectrometer (A Class Technology Associates Inc., Model: usb2000) were used to measure the properties of OLED 3. The result is shown in table 1.

[OLED 4]

OLED 4 was fabricated with the same method as the one for fabricating OLED 1, except that the toluene solution of the curable material 1 was replaced by the toluene solution of the curable material 2 as the hole transporting layer material. The power supply (Keithley Company (US), Model: 2400) and the fluorescence spectrometer (A Class Technology Associates Inc., Model: usb2000) were used to measure the properties of OLED 4. The result is shown in table 1.

[OLED 5]

OLED 5 was fabricated with the same method as the one for fabricating OLED except that the toluene solution of the curable material 1 was replaced by the toluene solution of the curable material 3 as the hole transporting layer material. The power supply (Keithley Company (US), Model: 2400) and the fluorescence spectrometer (A Class Technology Associates Inc., Model: usb2000) were used to measure the properties of OLED 5. The result is shown in table 1.

[Comparative OLED 6]

An organic electroluminescent device 1 with the structure as shown in FIG. 1 was fabricated according to known methods. Specifically, an ITO-coated glass substrate was firstly washed by ultrasonic bath and further treated in an UV-ozone chamber. A PEDOT: PSS layer was spin-coated on the top of the ITO glass substrate and annealed at about 150° C. for about 15 minutes. Poly(9,9-dioctylfluorene) was then spin-coated on the top of the PEDOT:PSS layer as the emitting layer (about 70 nm). Finally, a thin cathode layer was deposited by successive thermal evaporation of a LiF layer (about 1 nm), a Ca layer (about 50 nm) and an Al layer (about 100 nm) under $1 \times 10^{-6}$ ton to accomplish the fabrication of a comparative OLED 6. The power supply (Keithley Company (US), Model: 2400) and the fluorescence spectrometer (A Class Technology Associates Inc., Model: usb2000) were used to measure the properties of OLED 6. The result is shown in table 1.

TABLE 1

|  | Maximum Luminance ($L_{max}$) (cd/m$^2$) | Maximum Efficiency ($LE_{max}$) (cd/area) | Chromaticity Coordinate (CIE 1931) (x, y) |
|---|---|---|---|
| OLED 1 | 4870 | 1.15 | (0.17, 0.08) |
| OLED 2 | 2560 | 0.49 | (0.17, 0.10) |
| OLED 3 | 5560 | 2.27 | (0.17, 0.10) |
| OLED 4 | 5450 | 1.2 | (0.17, 0.09) |
| OLED 5 | 4520 | 1.05 | (0.17, 0.08) |
| Comparative OLED 6 | 2410 | 0.50 | (0.16, 0.08) |

As shown in table 1, the organic light emitting diodes using the cured curable material of the present invention (OLED 1, 3, 4 and 5) exhibit better luminous efficiency than the known organic light emitting diode without using the curable material of the present invention (comparative OLED 6), and the chromaticity coordinate shows no significant shift. Furthermore, the addition of a known crosslinker (OLED 3) can further improve the whole efficiency in the case that the remaining conditions are the same. It is believed that such effect is that the cured curable material of the present invention has excellent solvent resistance. The cured layer thus formed can maintain as even and smooth of a surface during the fabrication of organic light emitting diode to increase the efficiency of the organic light emitting diode. Furthermore, according to the result of OLED 2 and comparative OLED 6, although the curable material used in OLED 2 is not subjected to a curing process and does not have a significant improvement in solvent resistance, the luminous efficiency of OLED 2 is still higher than comparative OLED 6. It is believed that because the curable material of the present invention has added a luminescent material (monomer 4) thereinto, the monomer 4 can provide a certain level of luminous benefit and the energy level of a hole transporting layer made from said curable material can match better with the emitting layer comparing to the PEDOT: PSS layer, thus facilitating the exciton transition combination.

In summary, the curable material of the present invention can be used as the hole transporting layer of the organic electroluminescent device to provide the organic electroluminescent device with excellent luminous efficiency. The energy level between the hole transporting layer and the emitting layer can become closer by adding a luminescent material used in the emitting layer of the organic electroluminescent device into the curable material of the present invention to assist the exciton recombination.

The above examples are merely used for illustrating the principle and effect of the present invention and describing the technical feature of the present invention, but not for limiting the scope of protection of the present invention. The modifications or replacements that can be easily accomplished by persons having ordinary skill in the art without departing from the technical principle and spirit of the present invention belong to the claimed scope of protection. Therefore, the scope of protection of the present invention is as defined in the claims as appended.

What is claimed is:

1. A curable material, which has a structure of formula I or formula II:

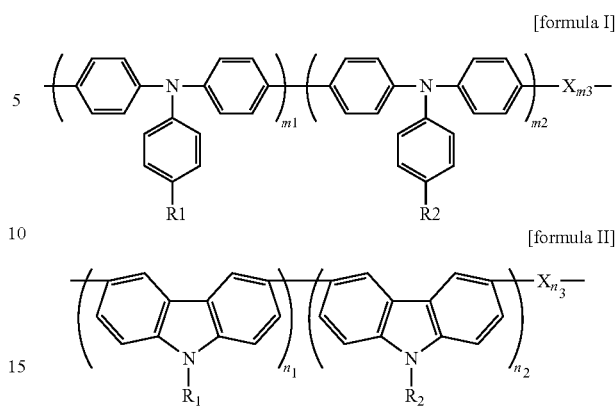

wherein,

X is a divalent luminescent organic group;

R1 is selected from the group consisting of

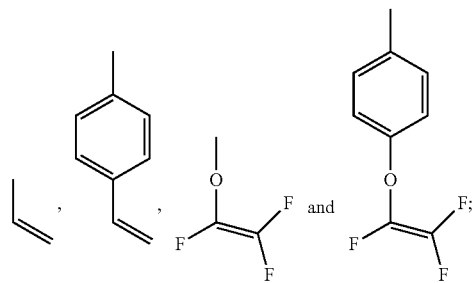

R2 is a mono-valent organic group without a curable group;

m1, m2, m3, n1, n2, and n3 are independently an integer greater than 1; and the ratio of m2 and m1 and the ratio of n2 and n1 are independently within the range of 2 to 10.

2. A curable material according to claim 1, wherein X is an unit having the following structure:

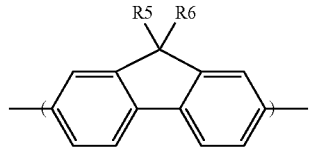

wherein R5 and R6 are independently a substituted or unsubstituted C2 to C40 aliphatic group or a substituted or unsubstituted C6 to C40 aromatic group.

3. A curable material according to claim 2, wherein R5 and R6 are independently a substituted or unsubstituted C4 to C16 aliphatic group or a substituted or unsubstituted C6 to C20 aromatic group.

4. A curable material according to claim 2, wherein R5 and R6 are independently a butyl group, a pentyl group, a hexyl group, an octyl group, a phenyl group substituted by an alkyl group, or a phenyl group substituted by an alkoxy group.

5. A curable material according to claim 1, wherein the ratio of (m1+m2) and m3 and the ratio of (n1+n2) and n3 are independently within the range of 0.6 to 1.8.

6. A curable material according to claim 1, wherein the ratio of (m1+m2) and m3 and the ratio of (n1+n2) and n3 are independently within the range of 0.8 to 1.2.

7. A curable material according to claim 1, wherein R1 is

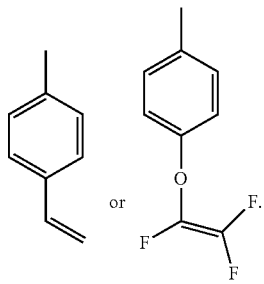

8. A curable material according to claim 1, wherein R2 is a substituted or unsubstituted C2 to C8 aliphatic group or a substituted or unsubstituted C6 to C20 aromatic group.

9. A curable material according to claim 8, wherein R2 is an ethyl group, a propyl group, a butyl group, a pentyl group, an unsubstituted phenyl group, a phenyl group substituted by an alkyl group, or a phenyl group substituted by an alkoxy group.

10. A curable material according to claim 1, wherein the weight average molecular weight of the curable material is within the range of 3,000 to 300,000.

11. A curable material according to claim 1, wherein the weight average molecular weight of the curable material is within the range of 5,000 to 100,000.

12. A curable material according to claim 1, wherein the curable material is used as a hole transporting material.

13. An organic electroluminescent device, comprising a first conductive layer, a hole transporting layer, an emitting layer and a second conductive layer, wherein the hole transporting layer comprises the curable material of claim 1.

* * * * *